(12) United States Patent
Sawazaki et al.

(10) Patent No.: US 10,434,884 B2
(45) Date of Patent: Oct. 8, 2019

(54) VEHICLE

(71) Applicants: TOYOTA JIDOSHA KABUSHIKI KAISHA, Toyota-shi, Aichi-ken (JP); DENSO CORPORATION, Kariya, Aichi-pref (JP)

(72) Inventors: Keisuke Sawazaki, Toyota (JP); Kenshi Yamanaka, Aichi-ken (JP); Ryusuke Baba, Nagoya (JP); Hiromi Yamasaki, Toyota (JP); Hitoshi Imura, Chiryu (JP); Hideaki Tachibana, Kariya (JP)

(73) Assignees: TOYOTA JIDOSHA KABUSHIKI KAISHA, Toyota-shi, Aichi-ken (JP); DENSO CORPORATION, Kariya-shi, Aichi-Pref. (JP)

( * ) Notice: Subject to any disclaimer, the term of this patent is extended or adjusted under 35 U.S.C. 154(b) by 0 days.

(21) Appl. No.: 15/939,454

(22) Filed: Mar. 29, 2018

(65) Prior Publication Data

US 2018/0281605 A1   Oct. 4, 2018

(30) Foreign Application Priority Data

Mar. 30, 2017 (JP) .................................. 2017-067515

(51) Int. Cl.
*H02P 1/54* (2006.01)
*B60L 11/18* (2006.01)
(Continued)

(52) U.S. Cl.
CPC ............ *B60L 11/1803* (2013.01); *B60K 6/26* (2013.01); *B60K 6/442* (2013.01); *B60K 6/52* (2013.01); *B60L 1/00* (2013.01); *B60L 15/007* (2013.01); *B60L 50/51* (2019.02); *H01L 23/4012* (2013.01); *H01L 23/473* (2013.01); *H02M 7/003* (2013.01); *H05K 7/1432* (2013.01); *H05K 7/20927* (2013.01); *B60K 6/405* (2013.01); *B60L 2210/14* (2013.01); *B60L 2210/40* (2013.01);
(Continued)

(58) Field of Classification Search
CPC ......... H02M 2001/007; H02M 7/5387; B60K 6/52; B60K 6/26
See application file for complete search history.

(56) References Cited

U.S. PATENT DOCUMENTS

2017/0018939 A1   1/2017  Shiba
2019/0014686 A1*  1/2019  Nakamura ......... H05K 7/20272

FOREIGN PATENT DOCUMENTS

EP      3381737 A1 * 10/2018 ......... H01L 23/4012
JP      2013-066259 A    4/2013
(Continued)

*Primary Examiner* — Karen Masih
(74) *Attorney, Agent, or Firm* — Sughrue Mion, PLLC (57) ABSTRACT

A vehicle includes a motor housing accommodating motors for driving wheels, and a power control unit fixed on the motor housing. The power control unit includes: a stacked unit in which multiple power modules accommodating power semiconductor elements for electric power conversion and multiple coolers are stacked; and reactors. The stacked unit is disposed in the case of the power control unit such that the stacking direction of the power modules and the coolers is directed toward the vehicle-longitudinal direction. The reactors are disposed in the case so as not to overlap with the stacked unit as viewed from the stacking direction.

6 Claims, 6 Drawing Sheets

(51) Int. Cl.
  *B60L 15/00*   (2006.01)
  *H02M 7/00*   (2006.01)
  *H05K 7/14*   (2006.01)
  *H05K 7/20*   (2006.01)
  *B60K 6/26*   (2007.10)
  *B60K 6/442*   (2007.10)
  *B60K 6/52*   (2007.10)
  *B60L 1/00*   (2006.01)
  *H01L 23/40*   (2006.01)
  *H01L 23/473*   (2006.01)
  *B60L 50/51*   (2019.01)
  *H02M 3/158*   (2006.01)
  *H02M 7/5387*   (2007.01)
  *H02M 1/00*   (2006.01)
  *B60K 6/405*   (2007.10)

(52) U.S. Cl.
  CPC ..... *B60L 2210/42* (2013.01); *B60L 2240/525* (2013.01); *H02M 3/1584* (2013.01); *H02M 7/5387* (2013.01); *H02M 2001/007* (2013.01); *Y02T 10/645* (2013.01); *Y02T 10/646* (2013.01); *Y02T 10/7005* (2013.01); *Y02T 10/7241* (2013.01); *Y02T 10/7258* (2013.01)

(56) References Cited

FOREIGN PATENT DOCUMENTS

| | | |
|---|---|---|
| JP | 2015-23720 A | 2/2015 |
| JP | 2015-139344 A | 7/2015 |
| JP | 2015126640 A | 7/2015 |
| JP | 2015-204688 A | 11/2015 |
| KR | 10-2017-0008675 A | 1/2017 |

\* cited by examiner

VEHICLE

INCORPORATION BY REFERENCE

The disclosure of Japanese Patent Application No. 2017-067515 filed on Mar. 30, 2017 including the specification, drawings and abstract is incorporated herein by reference in its entirety.

BACKGROUND

1. Technical Field

A technique disclosed in the present specification relates to a vehicle. In particular, the technique relates to a vehicle equipped with motors for driving wheels.

2. Description of Related Art

A vehicle equipped with motors for driving wheels includes a power control unit using electric power of an electric power source so as to control drive electric power of the motors. Hereinafter, a vehicle including motors for driving wheels is referred to as an electric automobile in some cases, and the motors for driving wheels are referred to simply as "motors" in some cases. In electric automobiles, power control units are fixed on motor housings so as to shorten power cables to supply electric power to the motors in some cases (Japanese Patent Application Publication No. 2015-204688 and Japanese Patent Application Publication No. 2013-066259).

Each of the power control unit in JP 2015-204688 A and the power control unit in JP 2013-066259 A includes: a stacked unit in which multiple power modules accommodating power semiconductor elements for electric power conversion and multiple coolers are stacked; and reactors. The stacked unit is disposed inside a case of the power control unit in such a manner that the stacking direction of the power modules and the coolers is directed toward the vehicle-longitudinal direction. The reactors are arranged rearward of the stacked unit.

SUMMARY

In an electric automobile equipped with large-output motors, a power control unit handles a large electric power. As electric power handled by the power control unit becomes larger, a load of every power semiconductor element becomes greater. In order to reduce a load per power semiconductor element, two or more power semiconductor elements are connected in parallel in some cases. Alternatively, in an electric automobile in which multiple motors are installed, an inverter circuit and others are required in each of the motors, and thus more power semiconductor elements are required. That is, there are some electric automobiles that require many power modules accommodating power semiconductor elements. As the number of power modules that are stacked in the stacked unit becomes increased, a length in the stacking direction of the stacked unit becomes longer. If the stacked unit and the reactors are arranged in the stacking direction, the entire length of the power control unit becomes longer. When the power control unit is arranged in the vehicle such that the stacking direction of the power modules and the coolers is directed toward the vehicle-longitudinal direction, a great limitation to installation might be caused to the power control unit extending in the longitudinal direction. It has been desired a technique to reduce a length in the vehicle-longitudinal direction of a power control unit installed in a vehicle.

An aspect of the present disclosure relates to a vehicle. The vehicle includes: an electric power source; a motor housing; and a power control unit. The motor housing accommodates motors for driving wheels. The power control unit is fixed on the motor housing. The power control unit is configured to control drive electric power of the motors by using electric power of the electric power source. The power control unit includes: reactors; and a stacked unit in which multiple power modules and coolers are stacked. The multiple power modules accommodate power semiconductor elements for electric power conversion. The stacked unit is arranged such that in a case of the power control unit, a stacking direction of the power modules and the coolers is directed toward the longitudinal direction of the vehicle. The reactors are disposed, in the case, at positions where the reactors do not overlap with the stacked unit as viewed from the stacking direction. With the above configuration, it is possible to reduce the length in the vehicle-longitudinal direction of the power control unit installed in the vehicle. Hereinafter, for convenience of explanation, a surface of the case of the power control unit installed in the vehicle, the surface being directed toward the vehicle frontward direction is referred to as a front surface, and a surface of the case directed toward the vehicle rearward direction is referred to as a rear surface. In addition, a surface of the case installed in the vehicle directed toward the vehicle rightward direction is referred to as a right side surface, and a surface of the case directed toward the vehicle leftward direction is referred to as a left side surface. Here, the "vehicle rightward (the right side surface)" means the "right side (the right side surface)" in a posture directed toward the frontward direction of the vehicle, and the "vehicle leftward (the left side surface)" means the "left side (the left side surface)" in a posture directed toward the frontward direction of the vehicle. When either one of the right side surface and the left side surface is indicated without being distinguished from each other, this is referred to simply as a "lateral side surface".

In the above vehicle, the power control unit may include first voltage converter circuits and inverter circuits. The first voltage converter circuits may be configured to boost voltage of the electric power source. The inverter circuits may be configured to convert output electric power of the first voltage converter circuits to alternating current. A first capacitor may be connected between a first positive-electrode terminal and a first negative-electrode terminal that are located on the electric power source side of the first voltage converter circuits. A second capacitor may be connected between a second positive-electrode terminal and a second negative-electrode terminal on the inverter circuit side of the first voltage converter circuits. The first capacitor and the second capacitor may be disposed, in the case, on the same side in the vehicle-width direction so as to be adjacent to the stacked unit. In the above vehicle described in JP 2015-204688 A, the first capacitor is disposed adjacent to the stacked unit in the vehicle-width direction, and the stacked unit, the reactors, and the second capacitor are arranged in the stacking direction. The first capacitor and the second capacitor are arranged on the same side in the vehicle-width direction to be adjacent to the stacked unit, to thereby further reduce the length in the vehicle-longitudinal direction of the power control unit installed in the vehicle.

The above vehicle may further include: a rear motor; and an auxiliary-device battery. The motors may be for driving front wheels. The motor housing may be installed in a front compartment of the vehicle. The power control unit may further include: a rear inverter circuit; and a second voltage converter circuit. The rear inverter circuit may be configured to convert direct current electric power to drive electric power of the rear motor for driving rear wheels. The second voltage converter circuit may be configured to step down the voltage of the electric power source and provide this voltage to the auxiliary-device battery. The second voltage converter circuit may be disposed rearward of the reactors in the case. A rear motor connector connected to a rear motor power cable that sends electric power to the rear motor may be provided on a surface of the case, and the surface provided with the rear motor connector may be directed toward the rearward direction of the vehicle. An auxiliary-device battery connector connected to an auxiliary-device battery power cable that sends electric power from the second voltage converter circuit to the auxiliary-device battery may be provided on a surface of the case, and the surface provided with the auxiliary-device battery connector may be directed toward the vehicle-width direction. By providing the rear motor connector to the rear surface of the case, it is possible to shorten the rear motor cable. In addition, by providing the rear motor connector, which is provided on the lateral side surface of the case in the related art, to the rear surface, it is possible to provide the auxiliary-device battery connector to the lateral side surface of the case. With this, it becomes easier to connect the second voltage converter circuit and the auxiliary-device battery connector that are disposed at rearward positions inside the case. As a result, it is possible to eliminate wiring for connection of the circuit board located at an upper position in the case and the low-voltage connector to the second voltage converter circuit.

The above vehicle may further include an air conditioner. The main power connector connected to the main power cable that supplies the electric power of the electric power source to the power control unit may be provided on a surface of the case, and the surface provided with the main power connector may be directed toward the rearward direction of the vehicle. An air-conditioner connector may be provided at a rearward position of a side surface of the case, and the side surface provided with the air-conditioner connector may be directed toward the vehicle-width direction and may be located closer to the main power connector. The air-conditioner connector may be electrically connected to the main power connector inside the case. The air-conditioner connector may be connected to an air-conditioner cable that supplies the electric power of the electric power source to the air conditioner. The main power connector and the air-conditioner connector are disposed to be adjacent to each other with the corner of the power control unit interposed therebetween, to thereby shorten the connection path between the both.

In the above vehicle, the main power connector connected to the main power cable that supplies the electric power of the electric power source to the power control unit may be provided on a surface of the case, and the surface provided with the main power connector may be directed toward the rearward direction of the vehicle. The first capacitor may be disposed frontward of the main power connector as viewed from above, and the first capacitor and the main power connector may be connected to each other. With this configuration, it is possible to shorten the connection path between the first capacitor and the main power connector.

In the vehicle, the reactors may be disposed under the stacked unit. The power control unit may further include a circuit board on which an electric-power control circuit is mounted may be disposed above the stacked unit. The stacked unit and the reactors, which give off a large amount of heat, are used along with coolers using liquid coolant in some cases. The circuit board on which electric-power control circuits are mounted is disposed above the reactors and the stacked unit, to thereby suppress the circuit board from coming into contact with the liquid even if the liquid leaks out from the coolers. The circuit board is disposed at an upper position in the space inside the case (immediately under the upper cover), it is possible to facilitate the replacing work and the maintenance work of the circuit board.

The motor housing and the power control unit are typically installed in the front compartment of the vehicle. The details and further modifications of technique disclosed in the present specification will be described in Detailed Description of Embodiments as below.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Figure 1:
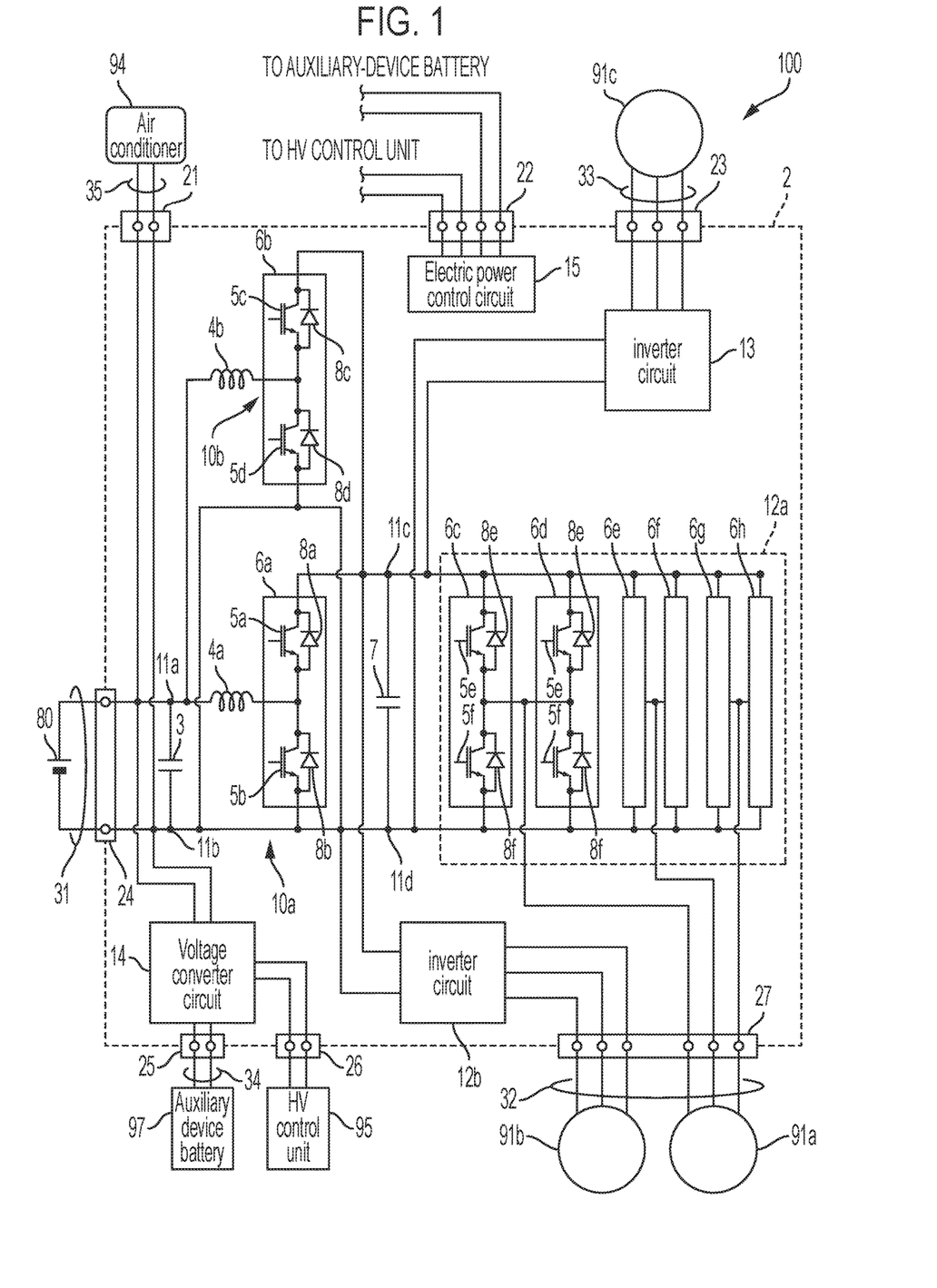
FIG. 1 is a block diagram of an electric power system of an electric automobile (hybrid vehicle) of an embodiment.

With reference to drawings, an electric automobile of an embodiment will be described. The electric automobile of the embodiment is a hybrid vehicle includes an engine and three motors as drive sources for traveling. First, an electric power system of a hybrid vehicle 100 will be described. FIG. 1 shows a block diagram of an electric power system of the hybrid vehicle 100. The hybrid vehicle 100 includes two motors (a first front motor 91a, a second front motor 91b) driving front wheels, and a rear motor 91c driving rear wheels. Hereinafter, for simplifying description, the first front motor 91a is referred to as a first F motor 91a, and the second front motor 91b is referred to as a second F motor 91b. Further, when the front motors and the rear motor are mentioned without being distinguished from each other, they are referred to simply as motors 91. Note that an electric automobile or a hybrid vehicle is one example of a vehicle in the present disclosure.

The three motors 91 are controlled by a power control unit (PCU) 2. The PCU 2 generates drive electric power for the respective three motors 91 by using electric power of a main battery 80. The PCU 2 includes three voltage converter circuits 10a, 10b, 14, three inverter circuits 12a, 12b, 13, and an electric-power control circuit 15. The main battery 80 is one example of an electric power source in the present disclosure.

The voltage converter circuits 10a, 10b will be described. The voltage converter circuits 10a, 10b are connected in parallel. The voltage converter circuits 10a, 10b can carry out a boost operation to boost voltage of the main battery 80 and provide this to the inverter circuits 12a, 12b, 13 and a step-down operation to step down the voltage of regenerative electric power (electric power generated by the motors 91) sent from the inverter circuits 12a, 12b, 13, and provide this to the main battery 80. The voltage converter circuits 10a, 10b are so-called bidirectional DC/DC converters. Terminals on the main battery 80 side of the voltage converter circuits 10a, 10b are referred to as a low-voltage positive-electrode terminal 11a and a low-voltage negative-electrode terminal 11b; and terminals on the inverter circuits 12a, 12b, 13 side of the voltage converter circuits 10a, 10b are referred to as a high-voltage positive-electrode terminal 11c, and a high-voltage negative-electrode terminal 11d.

The voltage converter circuit 10a includes two power transistors 5a, 5b, two freewheeling diodes 8a, 8b, and a reactor 4a. The two power transistors 5a, 5b are connected in series, and freewheeling diodes 8a, 8b are connected in anti-parallel with the respective power transistors 5a, 5b. The reactor 4a is connected between a middle point of the series connection between the two power transistors 5a, 5b and the low-voltage positive-electrode terminal 11a. The series connection between the two power transistors 5a, 5b is connected between the high-voltage positive-electrode terminal 11c and the high-voltage negative-electrode terminal 11d. The low-voltage negative-electrode terminal 11b is directly connected to the high-voltage negative-electrode terminal 11d. The power transistor 5b at a lower position in FIG. 1 is mainly in charge of the boost operation, and the power transistor 5a at an upper position in the drawing is mainly in charge of the step-down operation. The operation of the voltage converter circuit 10a in FIG. 1 is well known, and specific description thereof will be omitted.

The voltage converter circuit 10b includes two power transistors 5c, 5d, and two freewheeling diodes 8c, 8d, and a reactor 4b. The voltage converter circuit 10b has the same structure as that of the voltage converter circuit 10a, and thus description thereof will be omitted.

The low-voltage positive-electrode terminal 11a of the voltage converter circuit 10a and the low-voltage negative-electrode terminal 11b of the voltage converter circuit 10b are connected to a main power connector 24 of the PCU 2. A main power cable 31 that sends the electric power from the main battery 80 to the PCU 2 is connected to the main power connector 24. In other words, the main battery 80 is connected to the voltage converter circuits 10a, 10b via the main power cable 31 and the main power connector 24.

A filter capacitor 3 is connected between a terminal on the main battery 80 side of the voltage converter circuits 10a, 10b, that is, the low-voltage positive-electrode terminal (one example of a first positive-electrode terminal) 11a and the low-voltage negative-electrode terminal (one example of a first negative-electrode terminal) 11b. A smoothing capacitor 7 is connected between terminals on the inverter circuit side of the voltage converter circuits 10a, 10b, that is, the high-voltage positive-electrode terminal (one example of a second positive-electrode terminal) 11c and the high-voltage negative-electrode terminal (one example of a second negative-electrode terminal) 11d.

The reason why the PCU 2 includes the two voltage converter circuits 10a, 10b that are connected in parallel is to reduce a load per power transistor.

The two power transistors 5a, 5b that are connected in series, and the two freewheeling diodes 8a, 8b are accommodated in one single package, and this package is referred to as a power module 6a. The two power transistors 5c, 5d that are connected in series, and the two freewheeling diodes 8c, 8d are also accommodated in one single package, and this package is referred to as a power module 6b.

The inverter circuit 12a will be described. The inverter circuit 12a includes six power modules 6c to 6h each of which is the same as the power module 6a. FIG. 1 shows only internal structures of the power modules 6c, 6d, and illustrations of internal structures of the other power modules 6e to 6h are omitted. The power modules 6c to 6h are connected in parallel. As shown in FIG. 1, two power transistors 5e, 5f are connected in series in each of the power module 6c and the power module 6d. A freewheeling diode 8e is connected in anti-parallel with the power transistor 5e, and the freewheeling diode 8f is connected in anti-parallel with the power transistor 5f, respectively. Respective middle points of the series connections of the power transistors 5e, 5f are connected to each other. The respective two power transistors 5e of the power modules 6c, 6d located at upper positions in FIG. 1 are controlled to operate synchronously. The respective two power transistors 5f of the power modules 6c, 6d located at lower positions in FIG. 1 are controlled to operate synchronously. That is, the respective power modules 6c, 6d are controlled to operate synchronously so that they function as a single power module. The two power modules 6c, 6d are controlled to operate synchronously so as to reduce a load per power transistor.

The respective power modules 6e, 6f have the same connection structures as the structures of the power modules 6c, 6d. The respective power modules 6g, 6h also have the same connection structures as the structures of the power modules 6c, 6d. Alternating current is outputted from a middle point of the series connection between the power transistors 5e, 5f of the power module 6c and a middle point of the series connection between the power transistors 5e, 5f of the power module 6d. Alternating current is also outputted from a middle point of the series connection between the power transistors of the power module 6e and a middle point of the series connection between the power transistors of the power module 6f. Alternating current is outputted from a middle point of the series connection between the power transistors of the power module 6g and a middle point of the series connection between the power transistors of the power module 6h, as well. Each of the alternating currents of these tree types has a phase difference of 120 degrees, and the alternating currents of these three types compose a three-phase current. By controlling the power modules 6e, 6f to synchronously operate, and by controlling the power modules 6g, 6f to synchronously operate, it is possible to reduce a load per power transistor.

An internal cable transmitting the three-phase alternating current of the inverter circuit 12a is connected to a front motor connector 27. Hereinafter, when the power modules 6a to 6h are mentioned without being distinguished from one another, these power modules are referred to simply as power modules 6. Respective inverter circuits 12b, 13 described later also include the same power modules. These power modules are also referred to as "power modules 6".

The inverter circuit 12b has the same structure as that of the inverter circuit 12a, and an illustration of a circuit configuration of the inverter circuit 12b is omitted in FIG. 1.

The inverter circuit 12b also includes six power modules 6. An internal cable transmitting the three-phase alternating current of the inverter circuit 12b is also connected to the front motor connector 27. The front motor connector 27 is a connector to which a front motor power cable 32 that sends electric power to the two motors (the first F motor 91a and the second F motor 91b) involved with driving of the front wheels 81 (see FIG. 2) is connected. The first F motor 91a and the second F motor 91b are supplied with electric power from the PCU 2 via the front motor connector 27 and the front motor power cable 32.

Figure 2:
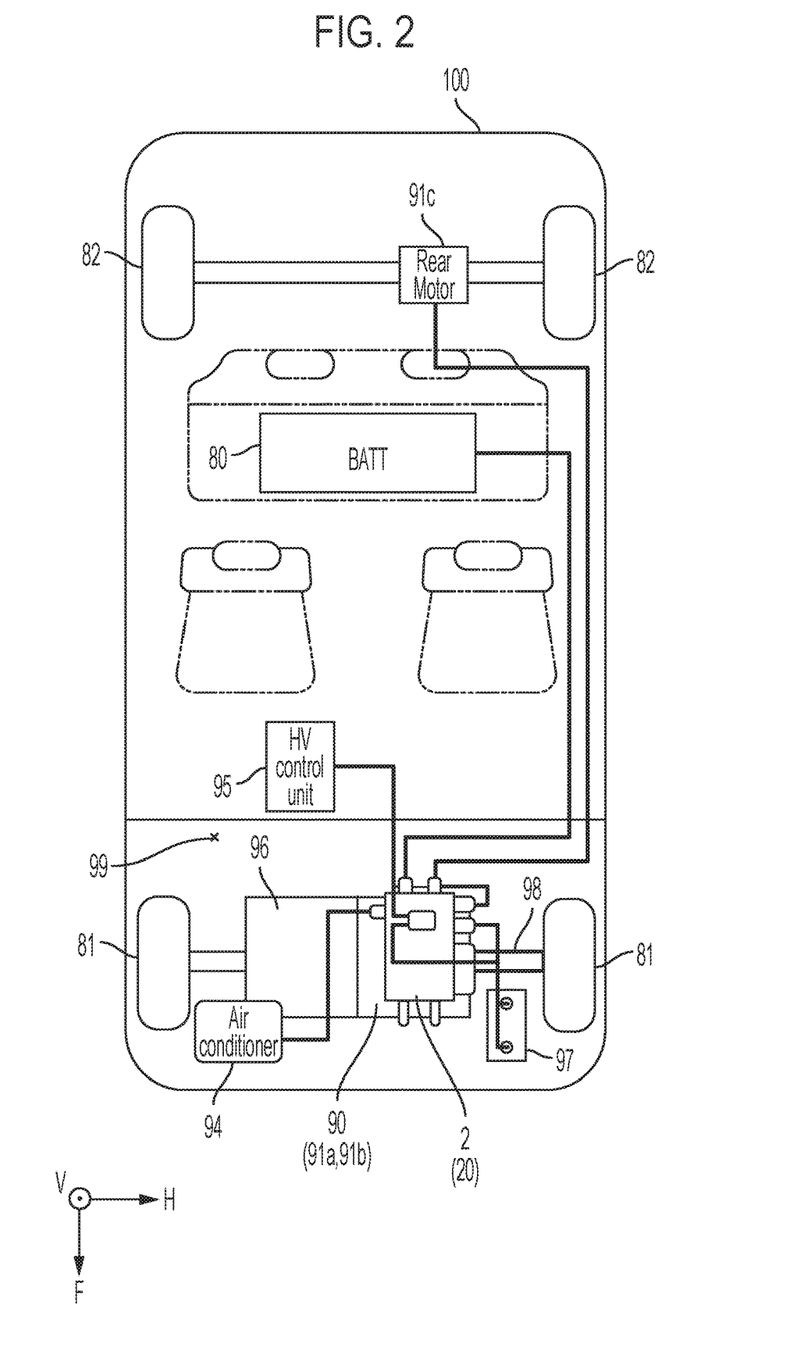
FIG. 2 is a plan view showing arrangements of electric devices in the hybrid vehicle.

The inverter circuit 13 generates drive electric power of the rear motor 91c that drives the rear wheels 82 (see FIG. 2). The inverter circuit 13 is connected to the high-voltage positive-electrode terminal 11c of the voltage converter circuit 10a and the high-voltage negative-electrode terminal 11d of the voltage converter circuit 10b. The inverter circuits 12a, 12b are configured such that the two power modules 6 operate in parallel, and the inverter circuit 13 includes three power modules so as to generate alternating currents, each having a phase difference of 120 degrees. This is because the rear motor 91c has a smaller output compared with those of the first F motor 91a and the second F motor 91b. The internal cable that transmits the three-phase alternating current of the inverter circuit 13 is connected to a rear motor connector 23. The rear motor connector 23 is a connector to which a rear motor power cable 33 that sends electric power to the rear motor 91c driving the rear wheels 82 is connected. The rear motor 91c is supplied with electric power from the PCU 2 via the rear motor connector 23 and the rear motor power cable 33.

The voltage converter circuit 14 will be described. The voltage converter circuit 14 is an electric-insulating type converter that converts the voltage via a transformer, different from the voltage converter circuits 10a, 10b. The electric-insulating type converter is well known, and thus a specific circuit diagram thereof is omitted. The voltage converter circuit 14 is connected to the main battery 80 via the main power connector 24. The voltage converter circuit 14 steps down the voltage of the main battery 80 to a voltage of an auxiliary-device battery 97, and provides this to the auxiliary-device battery 97. The auxiliary-device battery 97 is a battery that supplies electric power to devices operating at low voltages, such as a car audio system and a room light. Devices receiving electric power supply from the auxiliary-device battery 97 so as to operate are collectively referred to as auxiliary devices. An electric-power control circuit 15 (described later) of the PCU 2 belongs to the "auxiliary devices".

The voltage converter circuit 14 is connected to the auxiliary-device battery 97 via an AMD connector 25 provided on a case of the PCU 2. The voltage converter circuit 14 operates in response to a command received from an HV control unit 95 that is a superordinate control unit to the PCU 2. The voltage converter circuit 14 and the HV control unit 95 are connected to each other via a DDC signal connector 26 provided on the case of the PCU 2.

The power transistors of the voltage converter circuits 10a, 10b, the inverter circuits 12a, 12b, 13 operate in response to commands received from the electric-power control circuit 15. The electric-power control circuit 15 is connected to the HV control unit 95 and the auxiliary-device battery 97 via a low-voltage connector 22. The electric-power control circuit 15 receives the electric power supply from the auxiliary-device battery 97, and operates in response to a command received from the HV control unit 95.

The PCU 2 functions as a relay that transmits electric power of the main battery 80 to an air conditioner 94. An air-conditioner connector 21 is provided in the case of the PCU 2. The air-conditioner connector 21 is connected to the main power connector 24 inside the case. The PCU 2 relays the electric power of the main battery 80 and sends this to the air conditioner 94.

The PCU 2, the first F motor 91a, and the second F motor 91b are installed along with the engine, in a front compartment of the vehicle. FIG. 2 shows a plan view of the hybrid vehicle 100.

A coordinate system in each drawing will be described. An arrow of an F-axis indicates a vehicle frontward direction, an arrow of a V-axis indicates a vehicle upward direction, and an arrow of an H-axis indicates a vehicle rightward direction. The "right side" and the "left side" are defined based on a posture directed toward the vehicle frontward direction. The direction of the H-axis may be expressed as the vehicle-width direction.

The engine 96, a transaxle 90, the air conditioner 94, and the auxiliary-device battery 97 are installed in the front compartment 99 of the hybrid vehicle 100. The first F motor 91a and the second F motor 91b are accommodated in the housing of the transaxle 90. Hence, the transaxle 90 may be referred to as a motor housing. The transaxle 90 and the engine 96 are coupled to each other, and are suspended to not-illustrated two side members. An axle 98 of the front wheels extends through the housing of the transaxle 90 and the housing of the engine 96.

The PCU 2 is fixed on the transaxle 90 (the motor housing). Since the PCU 2 is disposed on the transaxle 90, the front motor power cable 32 (see FIG. 1) that connects the PCU 2 to the first and the second F motors 91a, 91b can be shorter.

The auxiliary-device battery 97 is placed in the left front part (the right lower part in FIG. 2) of the front compartment 99, and the air conditioner 94 is connected to the right front part (the left lower part in FIG. 2) thereof.

Figure 3:
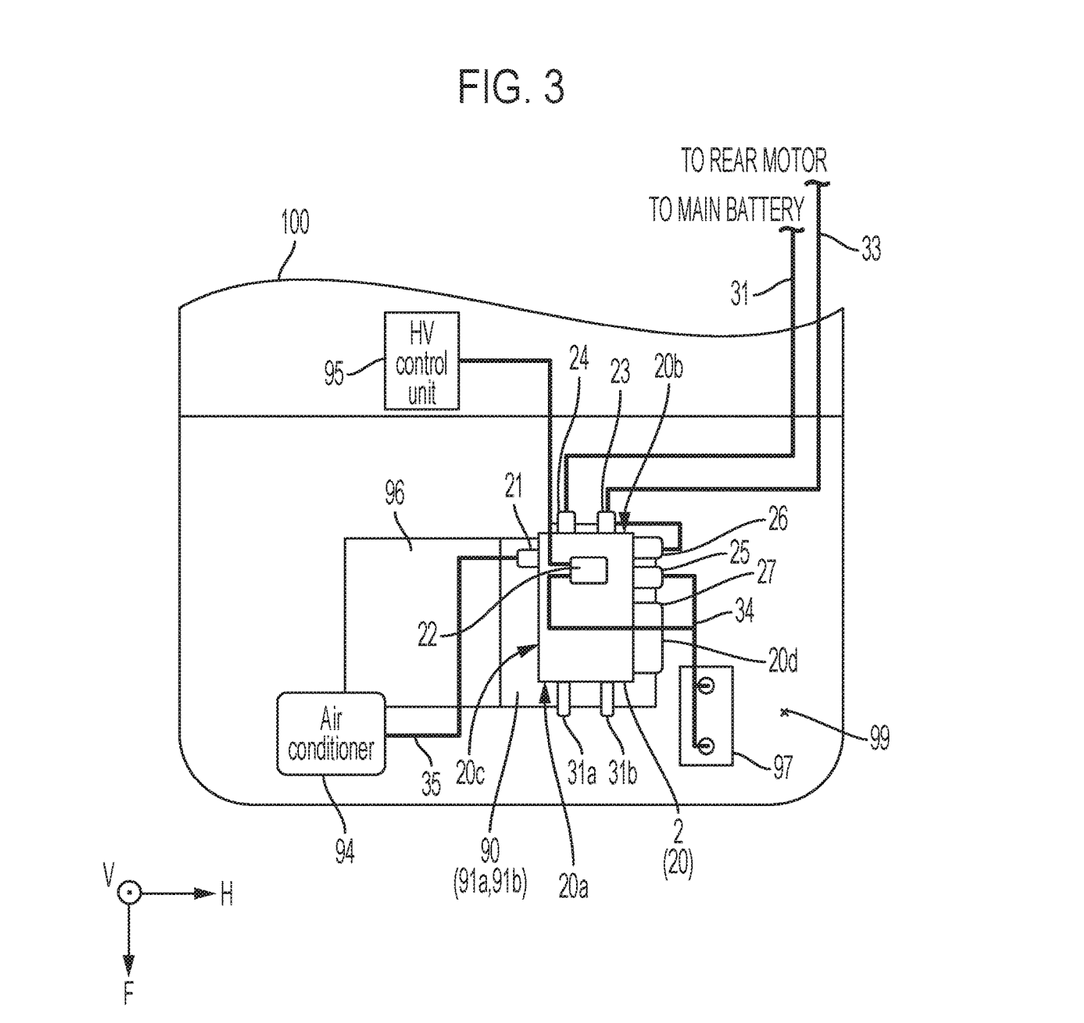
FIG. 3 is a plan view showing a device layout of a front compartment.

The main battery 80 is disposed under the rear seats, and the rear motor 91c is disposed in a rear-seat space of the vehicle. Bold lines in FIG. 2 indicate power cables, communication cables, and others. The PCU 2 is connected to various devices. With reference to FIG. 3, connectors included in the PCU 2 will be described.

FIG. 3 is a plan view showing the device layout in the front compartment 99, and the electric connecting relation between the PCU 2 and the other devices. First, respective surfaces of the case 20 of the PCU 2 will be defined. In the front compartment 99, a surface of the case 20 of the PCU 2 fixed on the transaxle 90, the surface being directed toward the vehicle frontward direction, is referred to as a front surface 20a. A surface of the case 20 directed toward the vehicle rearward direction is referred to as a rear surface 20b. A surface of the case 20 directed toward the rightward direction in the vehicle-width direction is referred to as a right side surface 20c, and a surface of the case 20 directed toward the leftward direction in the vehicle-width direction is referred to as a left side surface 20d. When the right side surface 20c and the left side surface 20d are indicated without being distinguished from each other, they are referred to simply as lateral side surfaces.

The case 20 is provided with seven connectors. The main power connector 24 and the rear motor connector 23 are provided on a rear surface 20b of the case 20. The front motor connector 27, the AMD connector 25, and a DDC signal connector 26 are provided on the left side surface 20d of the case 20. The air-conditioner connector 21 is provided on the right side surface 20c of the case 20. The low-voltage connector 22 is provided on the upper surface of the case 20.

The main power cable 31 that sends electric power from the main battery 80 is connected to the main power connector 24. The rear motor power cable 33 that sends electric power to the rear motor 91c is connected to the rear motor connector 23. The front motor power cable 32 that sends electric power to the first F motor 91a and the second F motor 91b is connected to the front motor connector 27. Note that the front motor power cable 32 is routed under the front motor connector 27, and thus the front motor power cable 32 is not visible in FIG. 2 and FIG. 3.

A cable (one example of an auxiliary-device battery power cable) 34 that sends electric power from the voltage converter circuit 14 inside the PCU 2 to the auxiliary-device battery 97 is connected to the AMD connector 25. The auxiliary-device battery 97 and the PCU 2 are connected to each other via the low-voltage connector 22. The electric power is supplied from the auxiliary-device battery 97 via the low-voltage connector 22 to the electric-power control circuit 15 (see FIG. 1) inside the case 20.

A communication cable communicating with the HV control unit 95 is connected to the DDC signal connector 26. The HV control unit 95 and the voltage converter circuit 14 are connected to each other via the DDC signal connector 26. The HV control unit 95 and the PCU 2 are connected to each other via the low-voltage connector 22. A command is sent from the HV control unit 95 via the low-voltage connector 22 to the electric-power control circuit 15 (see FIG. 1) inside the case 20.

A cable that sends electric power to the air conditioner 94 is connected to the air-conditioner connector 21. The air-conditioner connector 21 is connected to the main power connector 24 inside the case 20. The case 20 of the PCU 2 functions as a relay that sends the electric power of the main battery 80 to the air conditioner 94.

In the hybrid vehicle 100, the cables 31, 33 connected to the devices (the main battery 80, the rear motor 91c) disposed in the vehicle rear part are connected to the connectors (the main power connector 24, the rear motor connector 23) provided on the rear surface 20b of the case 20 of the PCU 2. A cable 35 connected to the air conditioner 94 disposed to the vehicle right front part (left lower part in FIG. 3) is connected to the connector (the air-conditioner connector 21) provided on the right side surface 20c of the case 20. A cable 34 connected to the auxiliary-device battery 97 disposed to the vehicle left front part (the right lower part in FIG. 3) is connected to the connector (the AMD connector 25) provided on the left side surface 20d of the case 20. In this manner, in the hybrid vehicle 100, many of the connectors of the PCU 2 are provided on the surfaces of the PCU 2 close to the devices that are the cable connection destinations.

Two pipes (a coolant supply pipe 31a and a coolant discharge pipe 31b) are connected to the front surface 20a of the case 20. The two pipes are connected to a not-illustrated coolant circulation apparatus.

Figure 4:
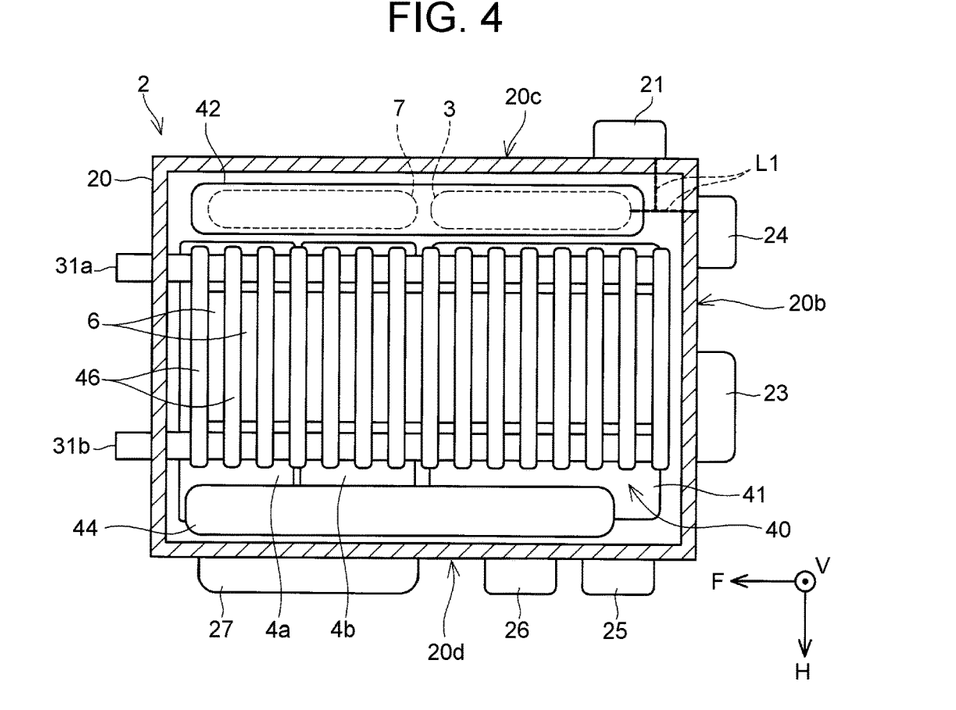
FIG. 4 is a plan view showing a device layout inside a case of a power control unit.
Figure 5:
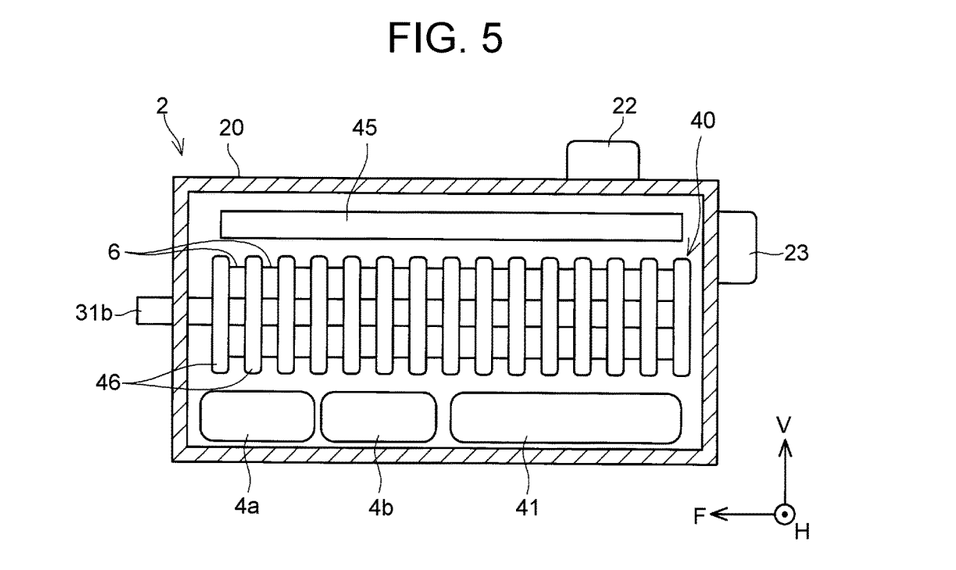
FIG. 5 is a side view showing the device layout inside the case of the power control unit.
Figure 6:
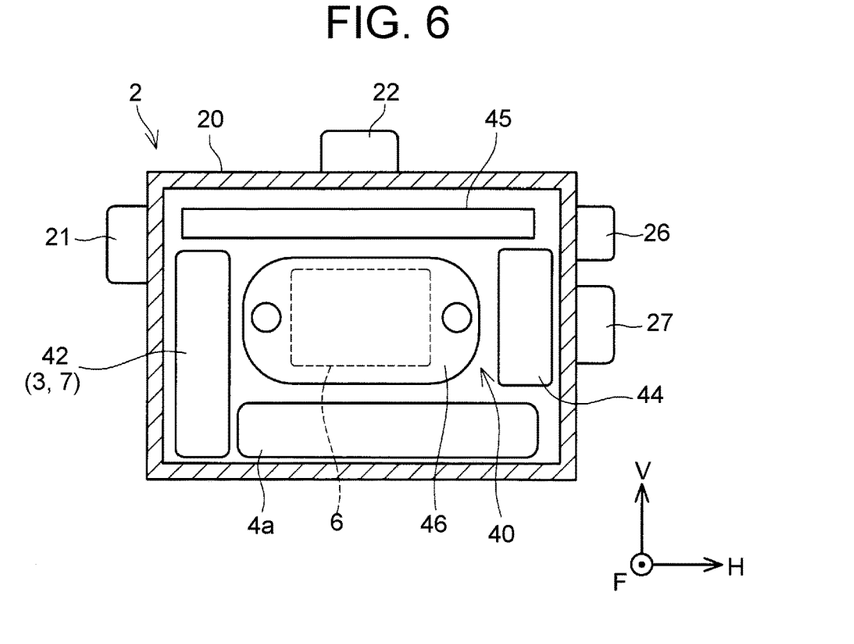
FIG. 6 is a front view showing the device layout inside the case of the power control unit.

With reference to FIG. 4 to FIG. 6, a device layout inside the case 20 of the PCU 2 is described. FIG. 4 is a plan view of the case 20 with an upper cover of the case 20 is cut off. FIG. 5 is a side view of the case 20 with a left side plate of the case 20 is cut off. FIG. 6 is a front view of the case 20 with a front plate of the case 20 is cut off. In FIG. 4, an illustration of a circuit board 45 (described later) disposed above a stacked unit 40 will be omitted. In FIG. 5, an illustration of a current sensor unit 44 (described later) is omitted. FIG. 4 to FIG. 6 are drawings explaining the device layout inside the case 20, and schematically show the respective devices in simple figures. Illustrations of connections between the respective devices and components used for fixing the devices are not illustrated.

The stacked unit 40, a capacitor unit 42, the current sensor unit 44, the two reactors 4a, 4b, a voltage converter unit 41 are accommodated inside the case 20.

The stacked unit 40 will be described. The stacked unit 40 is a unit formed by stacking multiple power modules 6 and multiple coolers 46. In FIG. 4 and FIG. 5, reference numerals 6 are added to only the two leftmost power modules, and reference numerals for the other power modules are omitted. In addition, in FIG. 4 and FIG. 5, reference numerals 46 are added to only the two leftmost coolers, and reference numerals for the other coolers are omitted. The multiple power modules 6 of the stacked unit 40 correspond to the power modules 6a to 6h, and the power module included in the inverter circuit 12b, and the power module included in the inverter circuit 13.

In the stacked unit 40, the coolers 46 and the power modules 6 are alternately stacked one by one, and the coolers 46 are in contact with both sides of the respective power modules 6. Flow passages where a liquid coolant flows are formed inside the coolers 46. The coolant supply pipe 31a and the coolant discharge pipe 31b extend through the multiple coolers 46 of the stacked unit 40. The coolant is distributed from the not-illustrated coolant circulation apparatus via the coolant supply pipe 31a. The coolant absorbs heat from the adjacent power modules 6 while the coolant flows through the inside of the respective coolers 46. The coolant having absorbed the heat is discharged via the coolant discharge pipe 31b to the outside of the stacked unit 40, and is then returned to the not-illustrated coolant circulation apparatus.

The stacked unit 40 is arranged in the case 20 such that the stacking direction of the power modules 6 and the coolers 46 is directed toward the vehicle-longitudinal direction as viewed from above the case 20. FIG. 4 corresponds to a view of the case 20 as viewed from above. The two reactors 4a, 4b are disposed under the stacked unit 40 (see FIG. 5, FIG. 6). The voltage converter unit 41 is disposed rearward of the reactors 4a, 4b (see FIG. 5). The voltage converter unit 41 is a unit that accommodates the voltage converter circuit 14 described in FIG. 1.

The capacitor unit 42 is arranged on the right side (the upper side in FIG. 4, the left side in FIG. 6) of the stacked unit 40. The capacitor unit 42 accommodates the filter capacitor 3 and the smoothing capacitor 7 described in FIG. 1. That is, in the inside of the case 20, the filter capacitor 3 and the smoothing capacitor 7 are arranged adjacent to the stacked unit 40 on the same side (on the right side of the vehicle) in the vehicle-width direction.

The main power connector 24 is provided at a rightward position of the rear surface 20b of the case 20. The air-conditioner connector 21 is provided at a rearward position of the right side surface 20c of the case 20. As described in FIG. 1, the main power connector 24 is connected to the air-conditioner connector 21 inside the case 20. In other words, the air-conditioner connector 21 is provided on the lateral side surface of the case 20, and at a rearward position of this lateral side surface (the right side surface 20c) closer to the main power connector 24. The air-conditioner connector 21 is a connector connecting the air-conditioner cable (35) that supplies electric power of the main battery 80 to the air conditioner 94.

As clearly shown in FIG. 4, the filter capacitor 3 is located frontward of the main power connector 24, as viewed from above. As described in FIG. 1, the main power connector 24 and the filter capacitor 3 are connected to each other. Bold broken lines L1 in FIG. 4 indicate connection paths between the main power connector 24, the air-conditioner connector 21, and the filter capacitor 3. As shown by the bold broken lines L1 in FIG. 4, the above layout allows the connection paths between the main power connector 24, the air-conditioner connector 21, and the filter capacitor 3 to be shorter. In particular, because the main power connector 24 and the air-conditioner connector 21 are adjacently disposed to each other with a corner of the case 20 interposed therebetween, the connection paths therebetween become shorter.

As shown in FIG. 4 and FIG. 6, the current sensor unit 44 is disposed on the left side of the stacked unit 40. Bus bars (not-illustrated) that send the three-phase alternating current outputted from the inverter circuits 12a, 12b pass through the current sensor unit 44, and reach the front motor connector 27. The current sensor unit 44 measures the current flowing through the respective bus bars (i.e. three-phase alternating current supplied to the first and the second F motors 91a, 91b).

As shown in FIG. 5, FIG. 6, the circuit board 45 is disposed above the stacked unit 40. The circuit board 45 is an electronic component to which the electric-power control circuit 15 described in FIG. 1 is mounted. The low-voltage connector 22 is provided on the upper surface of the case 20, and as aforementioned, the electric-power control circuit 15 mounted on the circuit board 45 receives the electric power supply from the auxiliary-device battery 97 via the low-voltage connector 22. In addition, the electric-power control circuit 15 receives a command from the HV control unit 95 via the low-voltage connector 22. Since the circuit board 45 and the low-voltage connector 22 are arranged to be close to each other, and thus it is possible to shorten the connection path between the circuit board 45 and the low-voltage connector 22.

As shown in FIG. 5 and FIG. 6, inside the case 20, the reactors 4a, 4b are arranged at positions where the reactors 4a, 4b do not overlap with the stacked unit 40 as viewed from the stacking direction (the F-axis direction in FIG. 5 and FIG. 6) of the stacked unit 40. Respective both ends in the stacking direction of the stacked unit 40 face the inner wall surfaces of the case 20. In other words, the both ends in the stacking direction of the stacked unit 40 are close to the inner wall surfaces of the case 20. The stacked unit 40 is a stacked body of the multiple power modules 6 and the multiple coolers 46, and has a longer length in the stacking direction. If at least one of the reactors 4a, 4b is arranged in such a manner as to overlap with the stacked unit 40 in the stacking direction, the length in the longitudinal direction of the case 20 becomes longer. The PCU 2 of the hybrid vehicle 100 of the embodiment is arranged such that both the reactors 4a, 4b do not overlap with the stacked unit 40 as viewed from the F-axis direction (the stacking direction), and the respective ends in the stacking direction of the stacked unit 40 face the inner wall surfaces of the case 20 so as to reduce the length in the vehicle-longitudinal direction of the case 20.

The description: "the reactors 4a, 4b are arranged at positions where the reactors 4a, 4b do not overlap with the stacked unit 40 as viewed from the stacking direction of the stacked unit 40" can be expressed as follows. That is, the reactors 4a, 4b are disposed apart from an extension from the stacked unit 40. Alternatively, the reactors 4a, 4b are disposed at positions deviating from the stacking direction of the stacked unit 40. The reactors 4a, 4b used in the PCU 2 for driving the wheels have large sizes, and thus they cause great influences on the length in the longitudinal direction of the case 20. In the PCU 2 of the embodiment, by improving the arrangement of the above-configured reactors 4a, 4b, the length in the vehicle-longitudinal direction of the case 20 can successfully be reduced.

The two capacitors (the filter capacitor 3, the smoothing capacitor 7) are arranged in such a manner as not to overlap with the stacked unit 40 as viewed from the stacking direction (the F-axis direction in FIG. 5 and FIG. 6). This respect contributes to reduction in length in the vehicle-longitudinal direction of the case 20 of the PCU 2.

In the PCU 2 of the embodiment, the circuit board 45 on which the circuits are mounted is disposed above the stacked unit 40. As aforementioned, the liquid coolant flows through the stacked unit 40. The liquid might leak out from the stacked unit 40. Since the circuit board 45 is disposed above the stacked unit 40, the circuit board 45 is prevented from being subjected to the liquid even if the liquid leaks out from the stacked unit 40.

Figure 7:
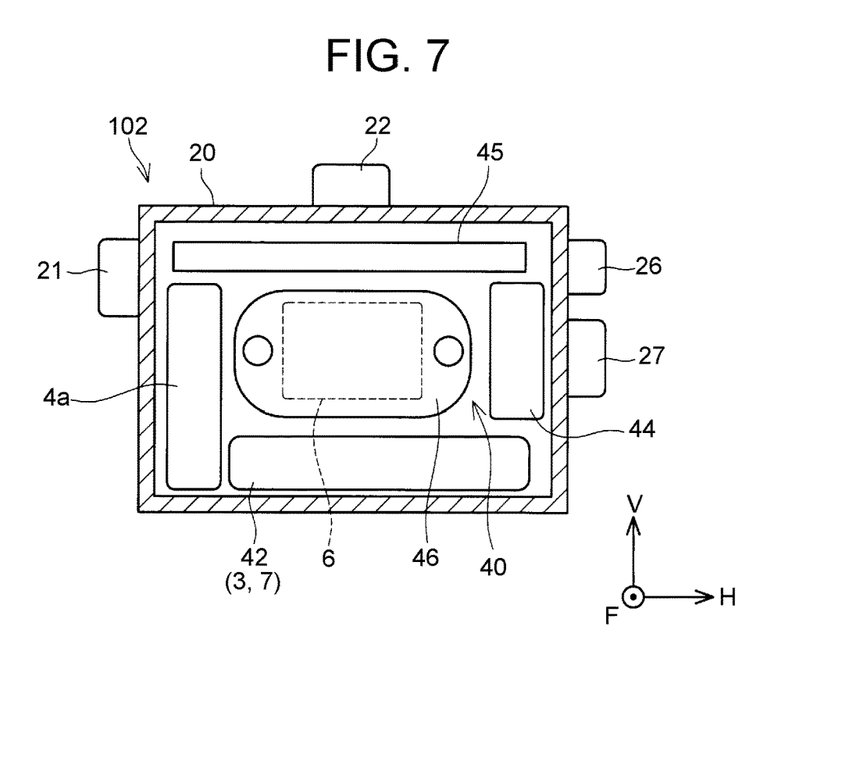
FIG. 7 is a front view showing a first variation of a device layout inside the case of the power control unit.

A first variation of the device layout inside the case of the PCU 2 will be described. FIG. 7 shows a front view of the device layout inside the case 20 of a PCU 102. The same reference numerals are added to the same components as those in FIG. 6. In this example, the reactor 4a is disposed on the vehicle right side (the left side in FIG. 7) of the stacked unit 40 as viewed from the stacking direction (the F-axis direction in FIG. 7). The reactor 4b is disposed at a more vehicle-rearward position than the reactor 4a. In addition, the capacitor unit 42 (the filter capacitor 3, the smoothing capacitor 7) are disposed under the stacked unit 40. Also in this variation, the reactors 4a, 4b are arranged not to overlap with the stacked unit 40 as viewed from the stacking direction (the F-axis direction in FIG. 7). The capacitor unit 42 (the filter capacitor 3 and the smoothing capacitor 7) is also disposed not to overlap with the stacked unit 40 as viewed from the stacking direction. The respective both ends in the stacking direction of the stacked unit 40 face the inner wall surfaces of the case 20. In other words, the respective both ends in the stacking direction of the stacked unit 40 are close to the inner wall surfaces of the case 20. In this variation, since the reactors 4a, 4b, and the filter capacitor 3 as well as the smoothing capacitor 7 are not aligned to the stacked unit 40 in the stacking direction, it is possible to reduce the length in the vehicle-longitudinal direction of the PCU 102.

Figure 8:
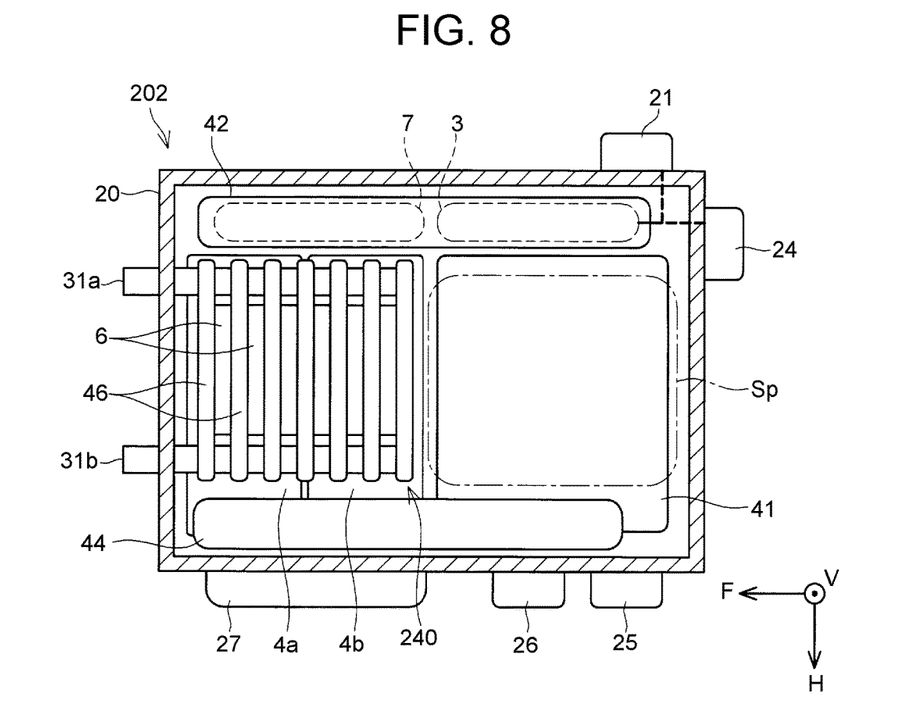
FIG. 8 is a plan view showing a second variation of the device layout inside the case of the power control unit.
Figure 9:
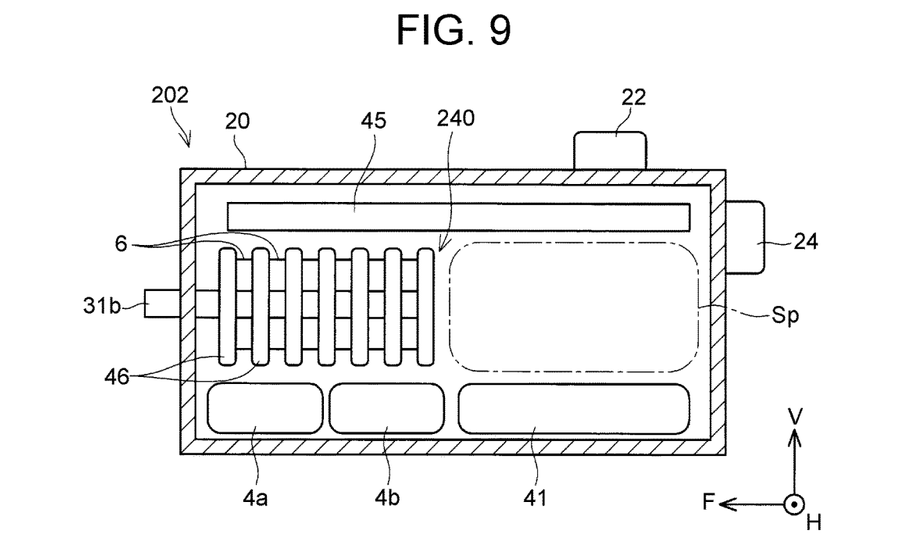
FIG. 9 is a side view showing the second variation of the device layout inside the case of the power control unit.

The second variation of the device layout inside the case of the PCU 2 will be described. FIG. 8 shows a plan view of the device layout inside the case 20 of a PCU 202. FIG. 9 shows a side view of the device layout inside the case 20 of the PCU 202. The same reference numerals are added to the same component as those of the PCU 2 shown in FIG. 4 and FIG. 5. The PCU 202 is installed in a compact two-wheel drive electric automobile. This electric automobile includes only one motor as a drive source for traveling. Hence, a stacked unit 240 of the PCU 202 has fewer power modules 6 than those of the stacked unit 40 of the above-described PCU 2. Accordingly, the length in the stacking direction of the stacked unit 240 is shorter than the length in the stacking direction of the stacked unit 40. In the meantime, the case 20 of the PCU 202 uses a case of the same type as the case of the above-described PCU 2. Hence, in the case 20 of the PCU 202, there is a greater space Sp adjacent to the stacked unit 240 in the stacking direction (the F-axis direction in FIG. 8 and FIG. 9). In this manner, because no reactor is present in the stacking direction of the stacked unit, it becomes easier to increase or decrease the number of the power modules in the stacked unit. Note that in the space Sp in the case of the PCU 202, there may be disposed devices (such as capacitors and wire harnesses, for example) other than the reactors.

Remarks pertinent to the technique explained in the embodiment will be described. An electric power converter may be installed in a rear space of the vehicle.

The AMD connector 25 of the embodiment is one example of an auxiliary-device battery connector. The filter capacitor 3 of the embodiment is one example of a second capacitor. The transaxle 90 of the embodiment is one example of a motor housing. The inverter circuit 13 is one example of a rear inverter circuit. The voltage converter circuits 10*a*, 10*b* of the embodiment are one example of a first voltage converter circuit. The voltage converter circuit 14 accommodated in the voltage converter unit 41 of the embodiment is one example of a second voltage converter circuit.

It is sufficient that the stacking direction of the power modules 6 and the coolers 46 of the stacked unit 40 is generally directed toward the vehicle-longitudinal direction. For example, the stacking direction may slightly be inclined from the horizontal line as viewed from the vehicle-width direction, or may be slightly inclined relative to a straight line extending in the longitudinal direction as viewed from above.

An electric automobile (the hybrid vehicle 100) of the embodiment includes the two front motors 91*a*, 91*b* and the rear motor 91*c* for traveling. The technique disclosed in the present specification is not limited to the number of the motors for traveling. It is suitable to apply the technique disclosed in the present specification to an electric automobile including no rear motor. The technique disclosed in the present specification may be applicable to an automobile or a fuel cell vehicle including motors but no engine for traveling.

The electric automobile (the hybrid vehicle 100) of the embodiment includes the two reactors 4*a*, 4*b*. The technique disclosed in the present specification may be applicable to an electric automobile including a single reactor, or may be applicable to an automobile including three or more reactors.

As aforementioned, specific examples of the present disclosure have been described, but these examples merely illustrate some possibilities of the teachings and do not restrict the claims thereof. The technique set forth in the claims includes variations and modifications of the specific examples as described above. The technical elements disclosed in the present specification or the drawings may exhibit technical advantages separately or in various types of combinations, and are not limited to the combinations set forth in the claims at the time of filing of the application. Furthermore, the technique exemplified in the present specification and the drawings can achieve a plurality of aims simultaneously, and the achievement of one of them itself has technical advantages.

What is claimed is:

1. A vehicle comprising:
an electric power source;
a motor housing accommodating motors for driving wheels; and
a power control unit fixed on the motor housing, the power control unit being configured to supply electric power to the motors by using electric power from the electric power source,
wherein the power control unit comprises a case, reactors, and a stacked unit in which multiple power modules and multiple coolers are stacked, the multiple power modules accommodating power semiconductor elements for electric power conversion,
the stacked unit is arranged in the vehicle such that inside the case of the power control unit, a stacking direction of the power modules and the coolers is directed along a longitudinal direction of the vehicle, and
the reactors are disposed, inside the case, at positions where the reactors do not overlap with the stacked unit along the stacking direction.

2. The vehicle according to claim 1, wherein
the power control unit includes first voltage converter circuits and inverter circuits,
the first voltage converter circuits are configured to boost voltage of the electric power source,
the inverter circuits are configured to convert output electric power of the first voltage converter circuits to alternating current,
a first capacitor is connected between a first positive-electrode terminal and a first negative-electrode terminal that are located on an electric power source side of the first voltage converter circuits,
a second capacitor is connected between a second positive-electrode terminal and a second negative-electrode terminal on an inverter circuit side of the first voltage converter circuits, and
the first capacitor and the second capacitor are disposed, in the case, on the same side in a vehicle-width direction so as to be adjacent to the stacked unit.

3. The vehicle according to claim 1, further comprising:
a rear motor; and
an auxiliary-device battery,
wherein the motors are for driving front wheels,
the motor housing is installed in a front compartment of the vehicle,
the power control unit further includes a rear inverter circuit and a second voltage converter circuit,
the rear inverter circuit is configured to convert direct current electric power to supply electric power to the rear motor for driving rear wheels,
the second voltage converter circuit is configured to step down a voltage of the electric power source and provide the voltage to the auxiliary-device battery,
the second voltage converter circuit is disposed rearward of the reactors in the case,
a rear motor connector connected to a rear motor power cable that sends electric power to the rear motor is provided on a first surface of the case, and the first surface provided with the rear motor connector is directed toward a rearward direction of the vehicle, and
an auxiliary-device battery connector connected to an auxiliary-device battery power cable that sends electric power from the second voltage converter circuit to the auxiliary-device battery is provided on a second surface of the case, and the second surface provided with the auxiliary-device battery connector is directed toward a vehicle-width direction.

4. The vehicle according to claim 1, further comprising an air conditioner,
wherein the motor housing is installed in a front compartment of the vehicle,
a main power connector connected to a main power cable that supplies the electric power of the electric power source to the power control unit is provided on a surface of the case, and the surface provided with the main power connector is directed toward a rearward direction of the vehicle, an air-conditioner connector is provided at a rearward position of a side surface of the case, and the side surface provided with the air-conditioner connector is directed toward a vehicle-width direction and is located closer to the main power connector, the air-conditioner connector is electrically connected to the main power connector inside the case, and the air-conditioner connector is connected to an air-conditioner cable that supplies the electric power of the electric power source to the air conditioner.

5. The vehicle according to claim 2, wherein the motor housing is installed in a front compartment of the vehicle, a main power connector connected to a main power cable that supplies the electric power of the electric power source to the power control unit is provided on a surface of the case, and the surface provided with the main power connector is directed toward a rearward direction of the vehicle, the first capacitor is disposed frontward of the main power connector as viewed from above, and the first capacitor and the main power connector are connected to each other.

6. The vehicle according to claim 1, wherein the reactors are disposed under the stacked unit, and the power control unit further includes a circuit board on which an electric-power control circuit is mounted, and the circuit board is disposed above the stacked unit.

* * * * *